(12) United States Patent
Racape

(10) Patent No.: US 7,652,522 B2
(45) Date of Patent: Jan. 26, 2010

(54) HIGH EFFICIENCY LOW COST BI-DIRECTIONAL CHARGE PUMP CIRCUIT FOR VERY LOW VOLTAGE APPLICATIONS

(75) Inventor: Emmanuel Racape, Aix-en-Provence (FR)

(73) Assignee: Atmel Corporation, San Jose, CA (US)

( * ) Notice: Subject to any disclaimer, the term of this patent is extended or adjusted under 35 U.S.C. 154(b) by 133 days.

(21) Appl. No.: 11/515,637

(22) Filed: Sep. 5, 2006

(65) Prior Publication Data

US 2008/0122506 A1    May 29, 2008

(51) Int. Cl.
G05F 1/10 (2006.01)
G05F 3/02 (2006.01)

(52) U.S. Cl. .................. 327/536; 363/59; 363/60

(58) Field of Classification Search .............. 327/536
See application file for complete search history.

(56) References Cited

U.S. PATENT DOCUMENTS

| | | | |
|---|---|---|---|
| 4,581,546 A | 4/1986 | Allan | |
| 5,196,996 A | 3/1993 | Oh | |
| 5,352,936 A | 10/1994 | Allen | |
| 5,546,296 A | 8/1996 | Savignac et al. | |
| 5,808,506 A | 9/1998 | Tran | |
| 5,818,289 A | 10/1998 | Chevallier et al. | |
| 5,874,850 A | 2/1999 | Pulvirenti et al. | |
| 5,889,428 A | 3/1999 | Young | |
| 6,023,188 A | 2/2000 | Lee et al. | |
| 6,026,003 A | 2/2000 | Moore et al. | |

(Continued)

FOREIGN PATENT DOCUMENTS

WO    WO-2005065138 A2    7/2005

(Continued)

OTHER PUBLICATIONS

John F. Dickson, *On-Chip High Voltage Generation in MNOS Integrated Circuits Using an Improved Voltage Multiplier Technique*, IEEE Journal of Solid-State Circuits, vol. SC-11, No. 3, Jun. 1976.

(Continued)

*Primary Examiner*—Lincoln Donovan
*Assistant Examiner*—Daniel Rojas
(74) *Attorney, Agent, or Firm*—Schwegman, Lundberg & Woessner, P.A.

(57) ABSTRACT

A method and system for providing an output voltage greater than a voltage of a voltage supply in a semiconductor device are disclosed. The method and system include providing basic stage(s) and/or a bi-directional stage and basic stage(s) coupled with the bi-directional stage. The bi-directional stage includes boosting capacitors, N-type devices, and an interface and allows operation in positive or negative configurations. A first of the basic stage(s) is coupled with the interface. The basic stage includes first and second sections. The first section includes pumping node(s) coupled with pumping capacitor(s), device(s) coupled with the pumping node(s), and auxiliary capacitors for providing an overshoot for the device(s) for value(s) of the clock signals. The second section is analogous to the first section. A clock provides clock signals to the first and second sections and the bi-directional stage. The first and second sections alternately charge and fully discharge based on the clock signals.

19 Claims, 6 Drawing Sheets

U.S. PATENT DOCUMENTS

| | | | |
|---|---|---|---|
| 6,043,716 | A | 3/2000 | Warner |
| 6,130,574 | A | 10/2000 | Bloch et al. |
| 6,163,487 | A | 12/2000 | Ghilardelli |
| 6,166,585 | A | 12/2000 | Bazzani |
| 6,198,342 | B1 | 3/2001 | Kawai |
| 6,353,356 | B1 | 3/2002 | Liu |
| 6,359,500 | B1 | 3/2002 | Zanuccoli et al. |
| 6,418,040 | B1 | 7/2002 | Meng |
| 6,429,723 | B1 | 8/2002 | Hastings |
| 6,437,637 | B2 | 8/2002 | Myono |
| 6,448,841 | B1 | 9/2002 | Milazzo |
| 6,448,842 | B2 | 9/2002 | Zanuccoli et al. |
| 6,466,079 | B1 | 10/2002 | Kushnarenko |
| 6,515,535 | B2 | 2/2003 | Myono |
| 6,552,600 | B2 | 4/2003 | Walimbe et al. |
| 6,677,806 | B2 | 1/2004 | Bloch |
| 6,734,717 | B2 | 5/2004 | Min |
| 6,876,244 | B1 * | 4/2005 | Moraveji ............ 327/374 |
| 6,927,441 | B2 | 8/2005 | Pappalardo et al. |
| 6,952,129 | B2 | 10/2005 | Lin et al. |
| 7,046,076 | B2 | 5/2006 | Daga et al. |
| 2002/0114199 | A1 | 8/2002 | Negoi |
| 2002/0122324 | A1 | 9/2002 | Kim et al. |
| 2002/0125935 | A1 | 9/2002 | Sawada et al. |
| 2002/0190780 | A1 | 12/2002 | Bloch |
| 2003/0034827 | A1 | 2/2003 | Pagliato et al. |
| 2004/0104761 | A1 | 6/2004 | Yen |
| 2004/0263238 | A1 | 12/2004 | Thorp et al. |
| 2005/0212586 | A1 | 9/2005 | Daga et al. |
| 2007/0285150 | A1 | 12/2007 | Racape |

FOREIGN PATENT DOCUMENTS

| | | | |
|---|---|---|---|
| WO | WO 2005065138 A2 * | 7/2005 | |
| WO | WO-2007146002 A2 | 12/2007 | |
| WO | WO-2007146002 A3 | 12/2007 | |
| WO | WO-2008030728 A2 | 3/2008 | |
| WO | WO-2008030728 A3 | 3/2008 | |

OTHER PUBLICATIONS

Hongchin Lin, et al., *A New 4-Phase Charge Pump Without Body Effects for Low Supply Voltages*, Proc. ISCAS'2001.

Jean-Michel Daga, et al., *High Efficiency Bi-Directional Charge Pump Circuit*, U.S. Appl. No. 11/221,309.

Emmanuel Racape, *Method and System for Providing a Charge Pump for Very Low Voltage Applications*, U.S. Appl. No. 11/449,052.

"U.S. Appl. No. 10/810,033, Amendment and Response filed Dec. 19, 2005 to Non-Final Office Action Jun. 17, 2005", 32 pgs.

"U.S. Appl. No. 10/810,033, Non-Final Office Action mailed Jun. 17, 2005", 8 pgs.

"U.S. Appl. No. 10/810,033, Notice of Allowance mailed Jan. 31, 2006", 4 pgs.

"U.S. Appl. No. 11/449,052, Non-Final Office Action mailed Sep. 27, 2007", 5 pgs.

"U.S. Appl. No. 11/449,052 Response filed Mar. 25, 2008 to Non-Final Office Action mailed Mar. 27, 2007", 17 pages.

"U.S. Appl. No. 11/449,052 Response filed Jul. 29, 2008 to Final Office Action mailed May 29, 2008", 19 pages.

"U.S. Appl. No. 11/449,052 Final Office Action mailed May 29, 2008", 7 Pgs.

"Chinese Application Serial No. 200480041674.0, Office Action mailed Jul. 4, 2008", 13 pages.

"U.S. Appl. No. 11/449,052 Notice of Allowance mailed Oct. 6, 2008.", 6 pgs.

Dickson, J. F., "On-chip high-voltage generation in MNOS Ics using an improved voltage multiplier technique", *IEEE Journal of Solid-State Circuits*, SC-11 (3), (Jun. 1976), pp. 374-378.

Favrat, Pierre, et al., "A new high efficiency CMOS voltage doubler", *Proceedings of the IEEE 1997 Custom Integrated Circuits Conference*, (1997), 259-262.

Lee, S-C., et al., "A Low-Ripple Switched-Capacitor DC-DC up Converter for Low-Voltage Applications", *IEICE Transactions on Electronics*, vol. E84-C No. 8, (Aug. 2001), 1100-1103.

Lin, H., et al., "New four-phase generation circuits for low-voltage charge pumps", *The 2001 IEEE International Symposium on Circuits and Systems*, 2001, ISCAS 2001, vol. 1, (May 6-9, 2001), 504-507.

Min, K-S., et al., "CMOS Charge Pumps Using Cross-Coupled Charge Transfer Switches with Improved Voltage Pumping Gain and Low Gate-Oxide Stress for Low-Voltage Memory Circuits", *IEICE Transactions on Electronics*, vol. E85-C No. 1, (Jan. 2002), 225-229.

"U.S. Appl. No. 11/449,052, Notice of Allowance mailed Jun. 12, 2009", 5 pgs.

"U.S. Appl. No. 11/449,052, Notice of Allowance mailed Jan. 30, 2009", 6 pgs.

200480041674.0, "Chinese Application Serial No. 200480041674.0, Office Action mailed Feb. 20, 2009", 5 pgs.

* cited by examiner

US 7,652,522 B2

HIGH EFFICIENCY LOW COST BI-DIRECTIONAL CHARGE PUMP CIRCUIT FOR VERY LOW VOLTAGE APPLICATIONS

CROSS-REFERENCE TO RELATED APPLICATIONS

This Application is related to co-pending application Ser. No. 11/449,052 entitled "METHOD AND SYSTEM FOR PROVIDING A CHARGE PUMP FOR VERY LOW VOLTAGE APPLICATIONS" filed on Jun. 7, 2006, and assigned to the assignee of the present application.

FIELD OF THE INVENTION

The present invention relates to semiconductor technology and more particularly to generation of higher voltage in low voltage devices.

BACKGROUND OF THE INVENTION

Semiconductor devices, such as EEPROMs or Flash devices, may be desired to be run using a voltage supply that provides a lower supply voltage. Although lower supply voltages are desired for the semiconductor devices, higher voltages may be desired for certain operations. For example, a voltage that is higher than the supply voltage may be required for operations such as programming or erasing memory cells in a Flash memory. In order to obtain the higher voltages, a conventional charge pump may be used.

FIG. 1 depicts a conventional charge pump 10, which can be used to increase voltages above the supply voltage or provide a reverse polarity voltage. The conventional charge pump 10 includes a conventional capacitor-diode ladder 12 and a conventional oscillator 20 coupled with a voltage supply 22. The conventional capacitor-diode ladder 12 includes capacitor-diode pairs 13 (including capacitor 14 and diode 24), 15 (including capacitor 16 and diode 26), and 17 (that includes capacitor 18 and diode 28). The conventional oscillator 20 outputs clocks signals CLK and CLKB. The diodes 24, 26, and 28 are typically NMOS devices that function as diodes. The signal CLKB is the inverse of the signal CLK.

Based on the signals CLK and CLKB, the capacitor-diode pairs 13, 15, and 17 alternately charge to approximately the supply voltage and discharge. For example, the capacitor-diode pair 13 charges the capacitor 14, then discharges the capacitor 14 and transfers the energy to the next capacitor-diode pair 15. The charging and discharging of capacitors 14, 16, and 18 in the capacitor-diode ladder 12 allows for energy to be transferred between capacitor-diode pairs 13, 15, and 17, and output. This energy is also transferred at the output 30 of the conventional charge pump 10 by an output current provided at the output 30. The conventional charge pump 10, has a gain per capacitor-diode pair of $V_{dd}-V_t$, where $V_{dd}$ is the supply voltage and $V_t$ is the threshold voltage of the NMOS devices 24, 26, and 28. Thus, a voltage above that of the conventional voltage supply 22 can be provided.

Although the conventional charge pump 10 functions, one of ordinary skill in the art will readily recognize that the conventional charge pump 10 may have significant drawbacks, particularly for lower supply voltages. The number of capacitor-diode pairs, such as the capacitor-diode pairs 13, 15, and 17, that can be cascaded is limited by the amount of the voltage drop increase between the source and the bulk of an NMOS device in the capacitor-diode pairs 13, 15, and 17. This drop results in a dramatic increase in the threshold voltage in the final stages. Consequently, a limited number of capacitor-diode pairs and, therefore, a limited gain may be achieved. Another drawback is that thick oxide, high voltage dedicated transistors are necessary to reliably sustain a large voltage drop between gate and bulk. Thus, thin oxide, low voltage standard devices which can sustain a maximum drop of $V_{dd}$ may not be used in the conventional charge pump 10. Moreover, when used in applications using a low supply voltage, the charge pump 10 provides a lower output current from the output 30 because charge is output at a lower rate from the capacitor-diode ladder 12. Furthermore, the high voltage from the conventional charge pump 10 may be on the order of the breakdown voltage of devices to which the voltage is applied, inducing breakdown leakage. As the output current of the conventional charge pump 10 decreases, the effect of the leakage becomes more marked. As a result, the ability of the conventional charge pump 10 to provide a sufficient output current in combination with a high voltage may be adversely affected.

In addition, the conventional charge pump 10 is typically uni-directional. Stated differently, the conventional charge pump 10 is typically used to provide a high positive voltage but not a high negative voltage. Another structure based on this conventional charge pump is used to generate a high negative voltage. Thus, to obtain both positive and negative high voltages for both programming and erasing, two conventional charge pumps are typically used. One conventional charge pump 10 is used for the program operation, while another conventional charge pump is used for the erase operation. Thus, such conventional charge pumps typically do not work at the same time. The area consumed by two conventional charge pumps may be extensive. As technology moves toward higher densities, such a large consumption of area is undesirable.

Accordingly, what is needed is an improved method and system for providing high positive or negative voltages, particularly in lower supply voltage devices. The present invention addresses such a need.

BRIEF SUMMARY OF THE INVENTION

The present invention provides a method and system for providing an output voltage having an output magnitude greater than an input magnitude of a voltage provided by a voltage supply in a semiconductor device. The method and system utilize a plurality of clock signals. In one aspect, the method and system include providing a basic stage that may be used to provide a unidirectional voltage having an output magnitude greater than an input magnitude of a voltage provided by a voltage supply. In another aspect, the method and system comprise providing a bi-directional stage and providing at least one basic stage. The bi-directional stage includes at least one pair of boosting capacitors, at least one pair of N-type devices, and an interface. The bi-directional stage allows the system to operate in a positive configuration or a negative configuration. A first is basic stage coupled to the interface of the bi-directional stage. The basic stage(s) includes a first section and a second section. The first section includes at least a first pumping node, at least one pumping capacitor coupled with the first pumping node, at least one device coupled with the pumping node(s), and at least a first and a second auxiliary capacitor for providing an overshoot for the at least one device for at least one value of the plurality of clock signals. The at least one auxiliary capacitor and the at least one pumping capacitor receive a first portion of the plurality of clock signals. The second section is coupled with the first section and includes at least a second pumping node. The at least one clock provides the first portion of the plurality of clock signals to the first section and a second portion of the plurality of clock signals to the second section, and a third portion of the plurality of clock signals to the bi-directional stage. The first section and the second section are configured to alternately charge and fully discharge based on the plurality of clock signals.

According to the method and system disclosed herein, the present invention may provide high positive and negative voltages in low voltage devices.

DETAILED DESCRIPTION OF THE INVENTION

Figure 1:
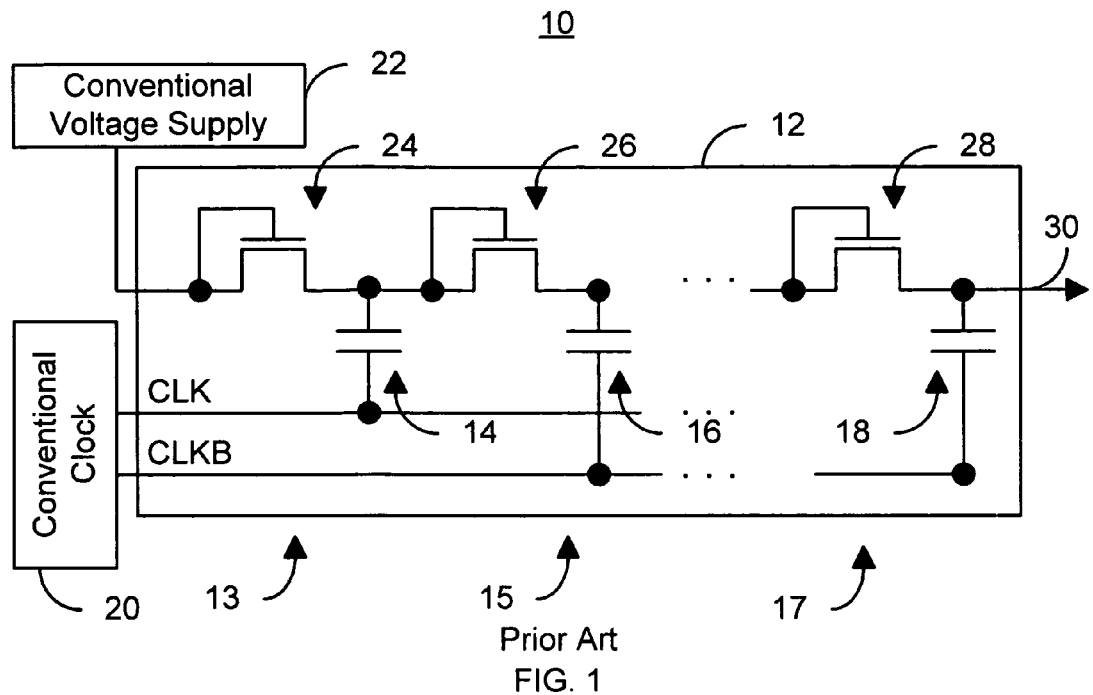
FIG. 1 is diagram depicting a conventional charge pump.

The present invention relates to semiconductor processing. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

The present invention provides a method and system for providing an output voltage having an output magnitude greater than an input magnitude of a voltage provided by a voltage supply in a semiconductor device. The method and system utilize a plurality of clock signals. In one aspect, the method and system include providing a basic stage that may be used to provide a unidirectional voltage having an output magnitude greater than an input magnitude of a voltage provided by a voltage supply. In another aspect, the method and system comprise providing a bi-directional stage and providing at least one basic stage. The bi-directional stage includes at least one pair of boosting capacitors, at least one pair of N-type devices, and an interface. The bi-directional stage allows the system to operate in a positive configuration or a negative configuration. The interface receives the voltage in the negative configuration and provides the output in the positive configuration. A first is basic stage coupled to the bi-directional stage. The basic stage(s) includes a first section and a second section. The first section includes at least a first pumping node, at least one pumping capacitor coupled with the first pumping node, at least one device coupled with the pumping node(s), and at least a first and a second auxiliary capacitor for providing an overshoot for the at least one device for at least one value of the plurality of clock signals. The at least one auxiliary capacitor and the at least one pumping capacitor receive a first portion of the plurality of clock signals. The second section is coupled with the first section and includes at least a second pumping node. The at least one clock provides the first portion of the plurality of clock signals to the first section and a second portion of the plurality of clock signals to the second section, and a third portion of the plurality of clock signals to the bi-directional stage. The first section and the second section are configured to alternately charge and fully discharge based on the plurality of clock signals.

The present invention will be described in terms of a semiconductor device having particular components. However, one of ordinary skill in the art will readily recognize that the method and system in accordance with the present invention may utilize other components consistent with the present invention. The present invention is also described in the context of providing a voltage higher than the supply voltage. However, one of ordinary skill in the art will readily recognize that the method and system may be used to provide reverse polarity voltages.

Figure 2:
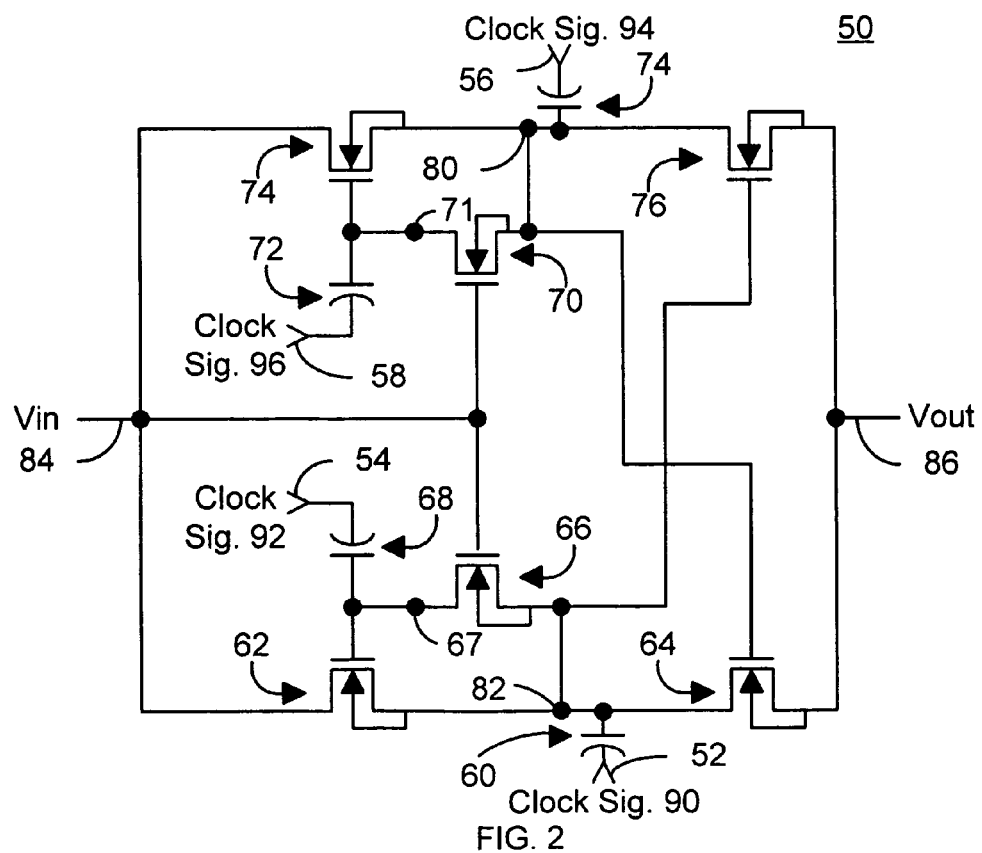
FIG. 2 is a diagram of a bi-directional charge pump for use with lower supply voltages.
Figure 3:
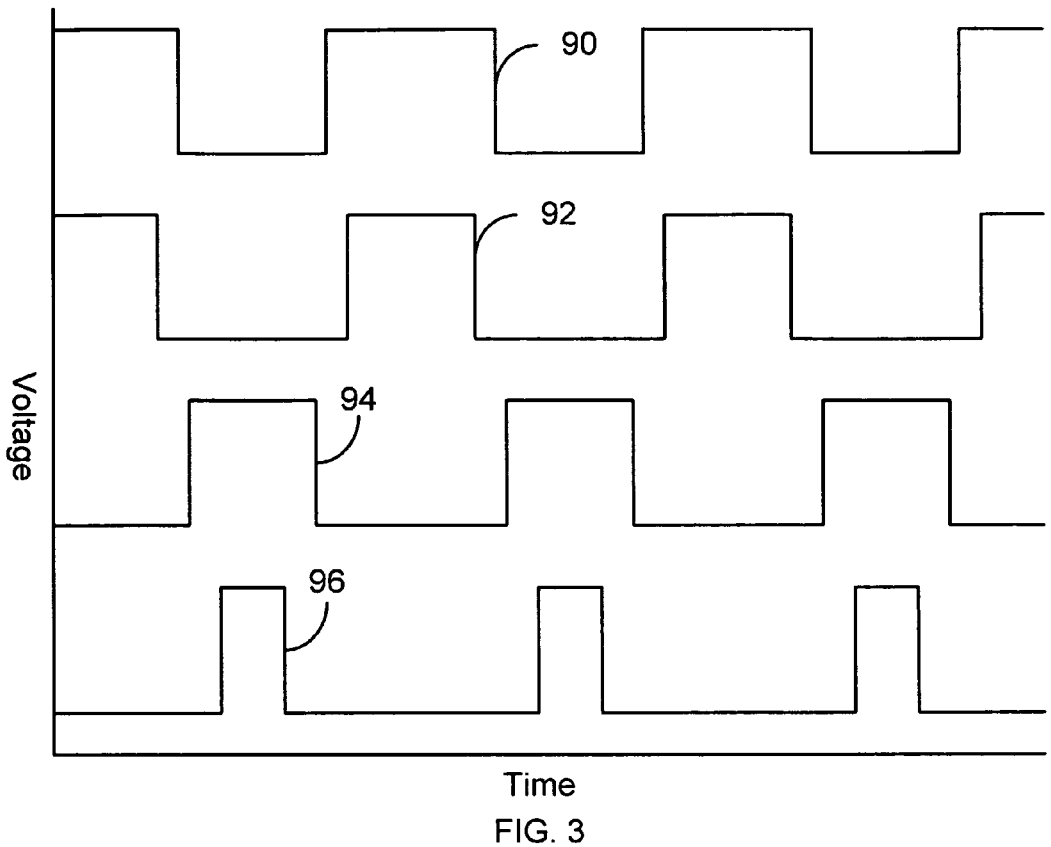
FIG. 3 is a diagram of clock signals for the bi-directional charge pump for use with lower supply voltages.

FIG. 2 is a diagram of a charge pump 50 for use with lower supply voltages. The charge pump 50 is one scheme that has been proposed to address the inability of conventional charge pumps, such as the charge pump 10, to operate as desired at low supply voltages. The charge pump 50 includes pumping capacitors 60 and 74, auxiliary capacitors 68 and 72, NMOS devices 62, 64, 66, 70, 74, 76, input/output 84 and output/input 86. In addition, the charge pump 50 utilizes inputs 52, 54, 56, and 58 for the four-phase clock signal. FIG. 3 depicts the clock signals 90, 92, 94, and 96. The input 84 receives an input voltage, $V_{in}$, that is preferably the supply voltage, $V_{dd}$.

Using the four phase clock signals 90, 92, 94, and 96, the limitations on gain per stage due to the threshold voltage and body effect of the NMOS devices 62, 64, 66, 70, 74, and 76 can be substantially reduced or eliminated by connecting the bulk of the switches formed by the NMOS devices 62, 64, 66, 70, 74, and 76 with triple well technology. In operation, a maximum voltage drop that is lower than the supply voltage $V_{dd}$ is maintained on the NMOS devices 62, 64, 66, 70, 74, and 76. Thus, the charge pump 50 can produce a gain that is very close to $V_{dd}$. The gain per stage of the charge pump 50 is thus is limited only by parasitics. In addition, the NMOS devices 62, 64, 66, 70, 74, and 76 avoids limitations due to threshold voltage drop and body effect by correctly connecting the bulk of the switched formed by the NMOS devices 63, 64, 66, 70, 74, and 76 with triple well technology. The triple well structure is preferably coupled to the highest potential applied to the charge pump 50 to prevent forward conduction of a diode formed by the deep n-well and the substrate. In the charge pump 50, the triple well is coupled to the input/output node 84. Further, the voltage difference between all the nodes of the NMOS devices does not exceed $V_{dd}$ on the charge pump 50. Consequently, thick gate oxides are not needed for the charge pump 50.

Although the charge pump 50 functions, one of ordinary skill in the art will recognize that there is a lower limit to the supply voltages with which the charge pump 50 functions as desired. For the charge pump 50, the following conditions hold: $V_{gate-source\ device\ 67} > V_t$, which means that $V_{node\ 67} - V_{node\ 82} > V_t$, where $V_t$ is the threshold voltage of a NMOS device 62, 64, 66, 70, 74, or 76. This conditions are analogous to $V_{gate-source\ device\ 74} > V_t$ and the $V_{node\ 71} - V_{node\ 56} > V_t$. Thus, when clock signals 90 and 92 are low, the voltage at the node 82 is $V_{in}$ and the voltage at node 67 is $V_{in} + V_t - V_{dd} * C_r$, where $C_r$ is $1(1+C_{para}/C_{capacitor\ 68})$ and $C_{para}$ is the total parasitic capacitance at the node 67. In order for the conditions above to be satisfied, $V_{dd} > 2 * V_t * (1 + C_{para}/C_{aux})$. If the parasitic capacitance is low, then the supply voltage with which the charge pump 50 can be used may be as low as approximately $2*V_t$. Thus, the lower limit for the supply voltage $V_{dd}$ for the charge pump 50 is approximately $2*V_t$. This lower limit for the supply voltage at which the charge pump 50 functions may be higher than is desired for some applications.

Moreover, when the signal 90 or 94 is low and the signal 92 or 96, respectively, is high, the discharge of the voltage at the node 67 or the node 71, respectively, may be incomplete. This is because the node 71 has a voltage of $V_{in} + V_t$. Because the discharge of the node 67 or 71 is incomplete, the ability of the charge pump 50 may be further compromised at low supply voltages.

In addition, one of ordinary skill in the art will recognize that the charge pump 50 is desired to be used in memories having cells that may be characterized by a relatively large leakage current. As a result, it is desirable to provide a larger output current via the output 86. In the case where $V_{dd}=1$ volt and $V_t$ is approximately 0.4 volt, the charge pump 50 may be at or near its operating limit. As a result, the charge pump 50 may be unable to provide the desired output current. Consequently, it is still desirable to provide a mechanism for providing a voltage that is higher than the supply voltage in devices having a very low supply voltage.

Figure 4:
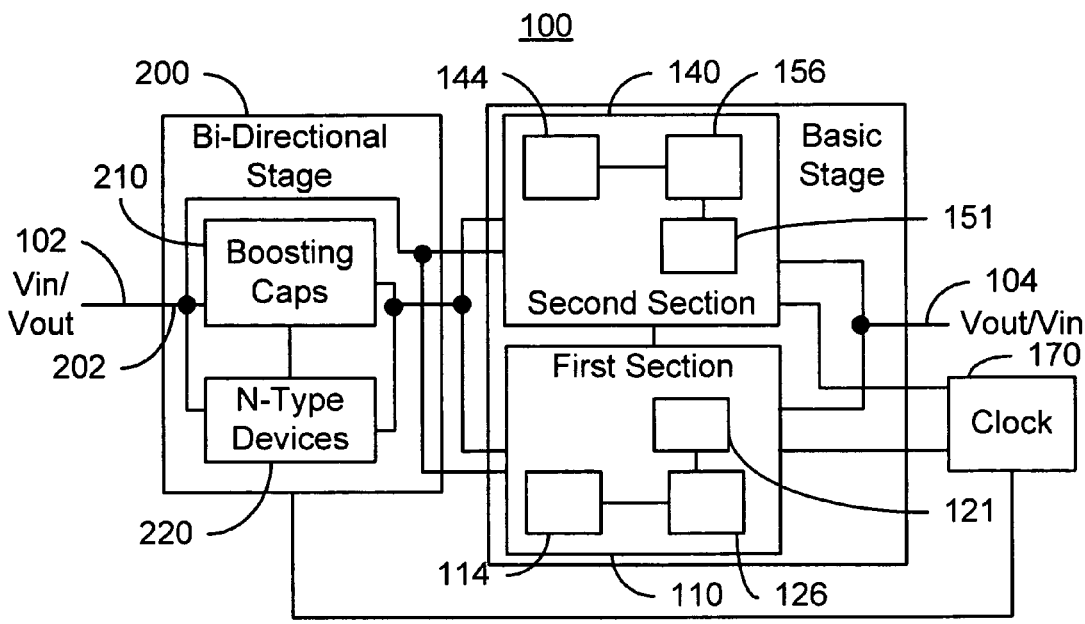
FIG. 4 is a diagram depicting one embodiment of a charge pump in accordance with the present invention for providing a bi-directional voltage.

To more particularly describe the present invention, refer to FIG. 4, depicting one embodiment of a system 100 in accordance with the present invention for providing a voltage higher than a supply voltage. The system 100 is preferably a charge pump. The system 100 includes an input 102, an output 104, a basic stage 101, and a bi-directional stage 200. Although only a single basic stage 101 is depicted, in an alternate embodiment, multiple basic stages 101 may be connected in series. In addition, although a single bi-directional stage 200 is depicted, in an alternate embodiment, multiple stages might be used. In yet another, unidirectional embodiment, the bi-directional stage 200 may be omitted. In such an embodiment, one or more basic stage(s) 101 would be coupled in series. The basic stage 101 includes a first section 110, and a second section 140. The basic stage 101 and the bi-directional stage 200 are driven by a clock 170. The clock provides a plurality of clock signals that are used to drive the first section 110, the second section 140, and the bi-directional stage 200. In a preferred embodiment, six clock signals are used.

The first section 110 includes at least one pumping node 114 that is preferably coupled with a pumping capacitor (not shown). Also in a preferred embodiment, the first stage includes auxiliary capacitor(s) 121 and a device 126 that is preferably an N-type device. The first section 110 is configured such that the pumping node 114 charges and fully discharges in response to a first portion of the plurality of clock signals provided by the clock 170. In a preferred embodiment, this is achieved using the auxiliary capacitor(s) 121 to overshoot the voltage on the gate of the device 126 during a portion of the period of the clock signals. Also in a preferred embodiment, the device 130 is an N-type device.

The second section 140 is analogous to and coupled with the first section 110. Consequently, the second section 140 includes at least one pumping node 144 that is preferably coupled with a pumping capacitor (not shown). The second section 140 also preferably includes auxiliary capacitor(s) 151 as well as a device 156 that is preferably an N-type device. The second stage is configured such that the pumping node 144 charges and fully discharges in response to a first portion of the plurality of clock signals provided by the clock 170. In a preferred embodiment, full charge of the node(s) 158 is achieved using the auxiliary capacitor(s) 162 to overshoot the voltage on the gate of the device 156 during a portion of the period of the clock signals. In addition the first section 110 and second section 140 are configured to alternately charge and fully discharge the pumping nodes 114 and 144, respectively, in response to the clock signals from the clock 170. Thus, the basic stage 101 boosts, or increases, a voltage that is provided to it.

The bi-directional stage 200 includes an interface 202, boosting capacitors 210 and N-type devices 220. In a preferred embodiment, a pair of boosting capacitors 210 and a pair of N-type device 220 are used. In one configuration, termed a negative configuration, the interface 202 receives an input voltage, $V_{in}$, and the charge pump 100 outputs a boosted, more negative voltage, $V_{out}$. In the opposite configuration, termed a positive configuration, the charge pump 100 receives the input voltage, $V_{in}$ at the "output" 104 and the bi-directional stage 200 provides a boosted, more positive voltage at the interface 202, which may be output at the "input" 102 of the system 100.

Because of the configuration of the sections 110 and 140 as well as the clock signals from the clock 170, a high gain per basic stage 101 may be achieved. This gain may be limited primarily by parasitic effects. In addition, degradation in the voltage provided due to the threshold voltage of the devices 126 and 156 may be avoided. Consequently, the system 100 may be used at very low supply voltages. In particular, the system 100 may function as desired for supply voltages that are greater than but approach the threshold voltage of the device 126 or 156. For example, for the charge pump 50, the supply voltage for desired operation is approximately $2V_t$. In contrast, the system 100 may operate as desired for supply voltage of approximately $V_t$. In addition, the gain for the system 100 is optimized such that $V_{out} = V_{in} + V_{dd}$. Thus, even at very low voltages, the system 100 may provide the desired high voltage with sufficient output current.

Moreover, because of the use of the bi-directional stage 200, the system 100 may be used in either the positive or negative configuration. Stated differently, the combination of the basic stage(s) 101 and the bi-directional stage 200 allow the system 100 to provide a positive or a negative voltage. In addition to acting as a charge pump at very low voltages, the system 100 may be used to provide either positive or negative voltages. Thus, for example, the system 100 may be used in programming or erasing a memory. Consequently, the area consumed in providing high positive or negative voltages may be reduced.

Figure 5:
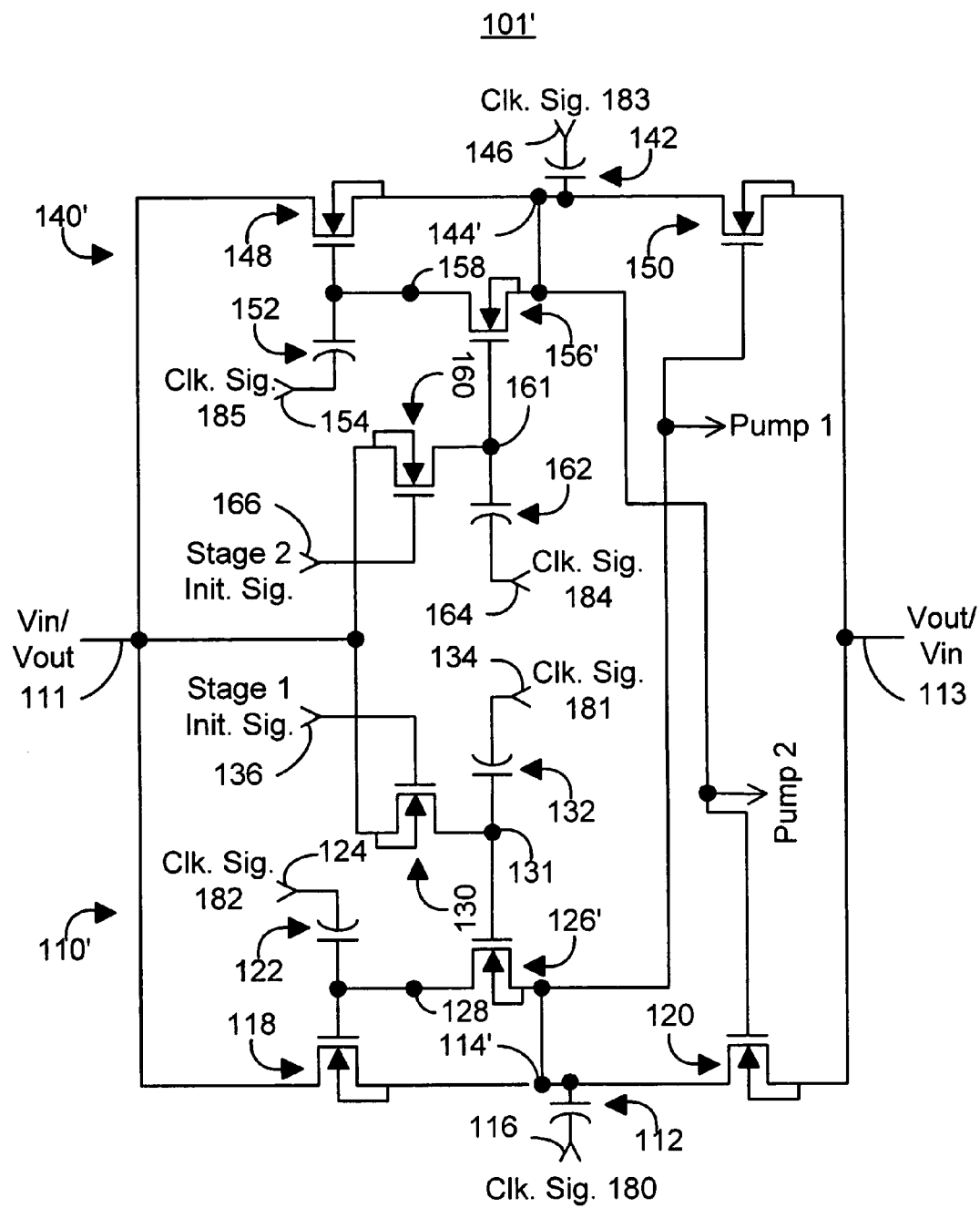
FIG. 5 is a diagram depicting a preferred embodiment of a basic stage of a charge pump in accordance with the present invention for providing a bi-directional voltage for very low voltage supplies.

FIG. 5 is a diagram depicting a preferred embodiment of a basic stage 101' in accordance with the present invention for providing a voltage higher than a supply voltage. This Application is related to co-pending application Ser. No. 11/449,052 entitled "METHOD AND SYSTEM FOR PROVIDING A CHARGE PUMP FOR VERY LOW VOLTAGE APPLICATIONS" filed on Jun. 7, 2006, and assigned to the assignee of the present application. Applicant hereby incorporates by reference the above-identified co-pending application. The basic stage 101' is described in more detail in the above-identified co-pending patent application. For clarity, the clock 170 is not explicitly shown in FIG. 5. Only the signals provided are indicated.

The basic stage 101' includes input 101' that receives signal $V_{in}$ in a negative configuration and provides the boosted voltage $V_{out}$ in a positive configuration, output/input 113' that outputs a boosted voltage $V_{out}$ in a negative configuration and receives the input voltage $V_{in}$ in the positive configuration, and sections 110' and 140'. The basic stage 101' is preferably part of the charge pump 100. The section 110' of the charge pump 100' includes pumping capacitor 112, auxiliary capacitors 122 and 132, NMOS devices 118, 120, 126', and 130, as well as inputs 116, 134, 136, and 124. In addition, the nodes 114' and 128 are also noted. The auxiliary capacitors 122 and 132 correspond to the auxiliary capacitor(s) 121 of FIG. 4. Referring back to FIG. 5, the section 140' of the charge pump 100' includes pumping capacitor 142, auxiliary capacitors 152 and 162, PMOS devices 148, 150, 156', and 160, as well as inputs 146, 164, 166, and 154. The auxiliary capacitors 152 and 162 correspond to the auxiliary capacitor(s) 151 of FIG. 4. Referring back to FIG. 5, the nodes 144' and 158 are also noted. The inputs 136 and 166 receive an initialization signal for the node 144' and 114', respectively, of the previous section 140' and 110', respectively. In addition, the components 112, 118, 120, 122, 126', 130, and 132 of the first phase 110' are preferably analogous to and have the size as their counterparts 142, 148, 150, 152, 156', 160, and 162, respectively, of the second phase 140'.

Figure 6:
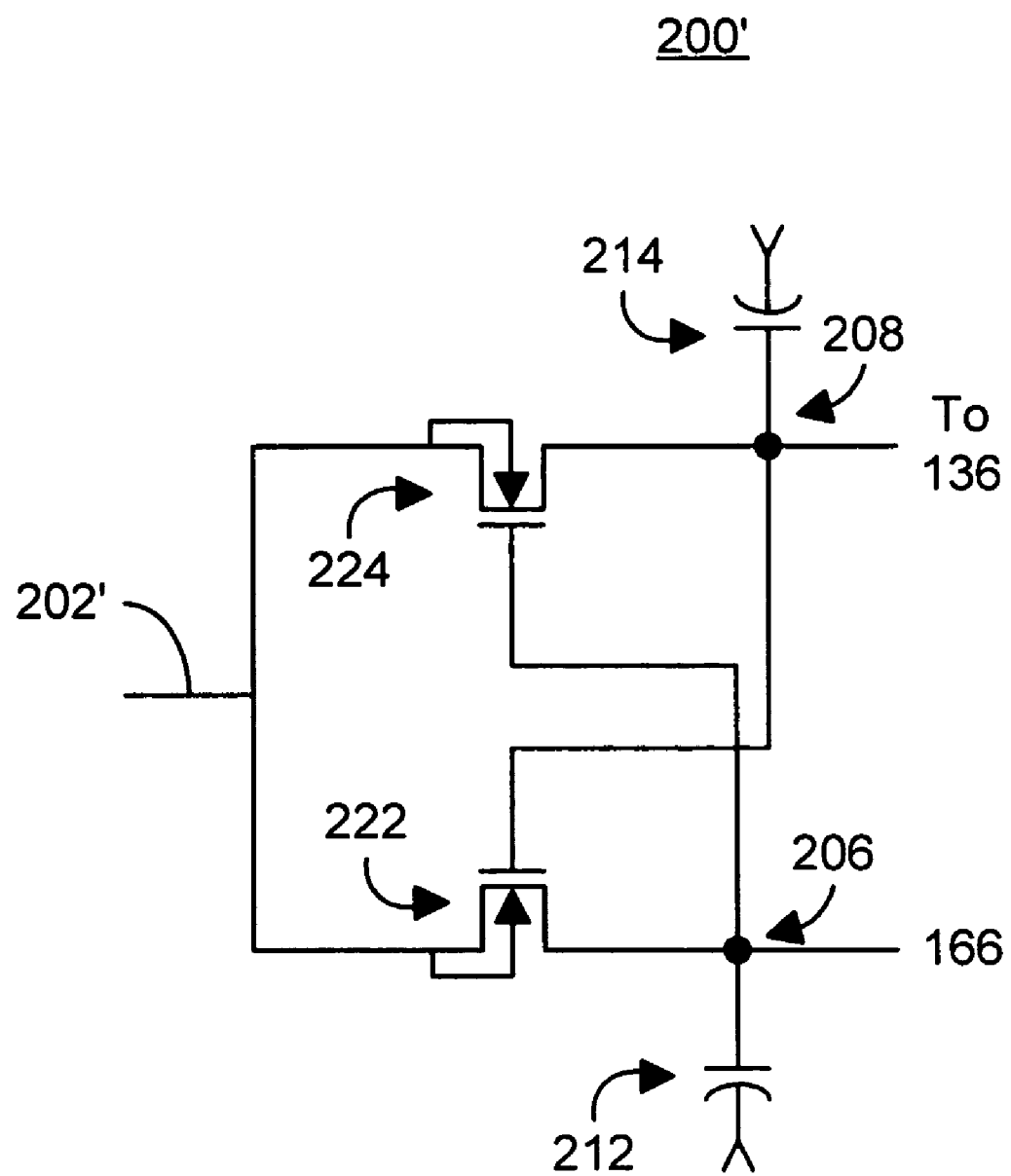
FIG. 6 is a diagram of one embodiment of a bi-directional stage of a charge pump in accordance with the present invention.

FIG. 6 is a diagram of one embodiment of a bi-directional stage 200' of a charge pump in accordance with the present invention, such as the charge pump 100. The bi-directional stage 200' is preferably coupled to only a first of one or more of the basic stage(s) 101'. Only one bi-directional stage 200/200' is needed irrespective of the number of the basic stages 101' used. In a preferred embodiment, therefore, only one bi-directional stage 200' is used in the charge pump 100. The bi-directional stage 200' includes boosting capacitors 212 and 214 that correspond to the boosting capacitors 210 depicted in FIG. 4 and N-type devices 222 and 224 that correspond to the N-type devices 220 depicted in FIG. 4. Also noted are nodes 206 and 208 that are coupled to the nodes 166 and 136, respectively, of the first basic stage 101'. The N-type devices 222 and 224 are preferably low voltage devices, analogous to the devices used in the basic stage 101'. The boosting capacitors 212 and 214 have low capacitances compared to those used in the basic stage 101'. The boosting capacitors 212 and 214 receive the clock signals, while the interface 202' is effectively connected to the input voltage in the negative configuration and to the output voltage in the positive configuration. The boosting capacitors 212 and 214 create conditions that allow for the appropriate signals on the inputs 136 and 166 of the basic stage 101'. For example, the capacitors 212 and 214 have capacitances that are less than the capacitances of the boosting capacitors in the basic stage(s) 101' because these capacitors serve to create an over-shoot for the gates of the N-type devices 222 and 224. For example, a capacitance of 0.5 pF may be used for the capacitors 212 and 214 when capacitances of 4 pF are used for the boosting capacitors. If the bi-directional stage 200' is not utilized, then the basic stage 101' is unidirectional and functions in a negative mode. In such a case, the nodes 136 and 166 of the first stage are connected to the clock signals 183 and 180, respectively.

Figure 7:
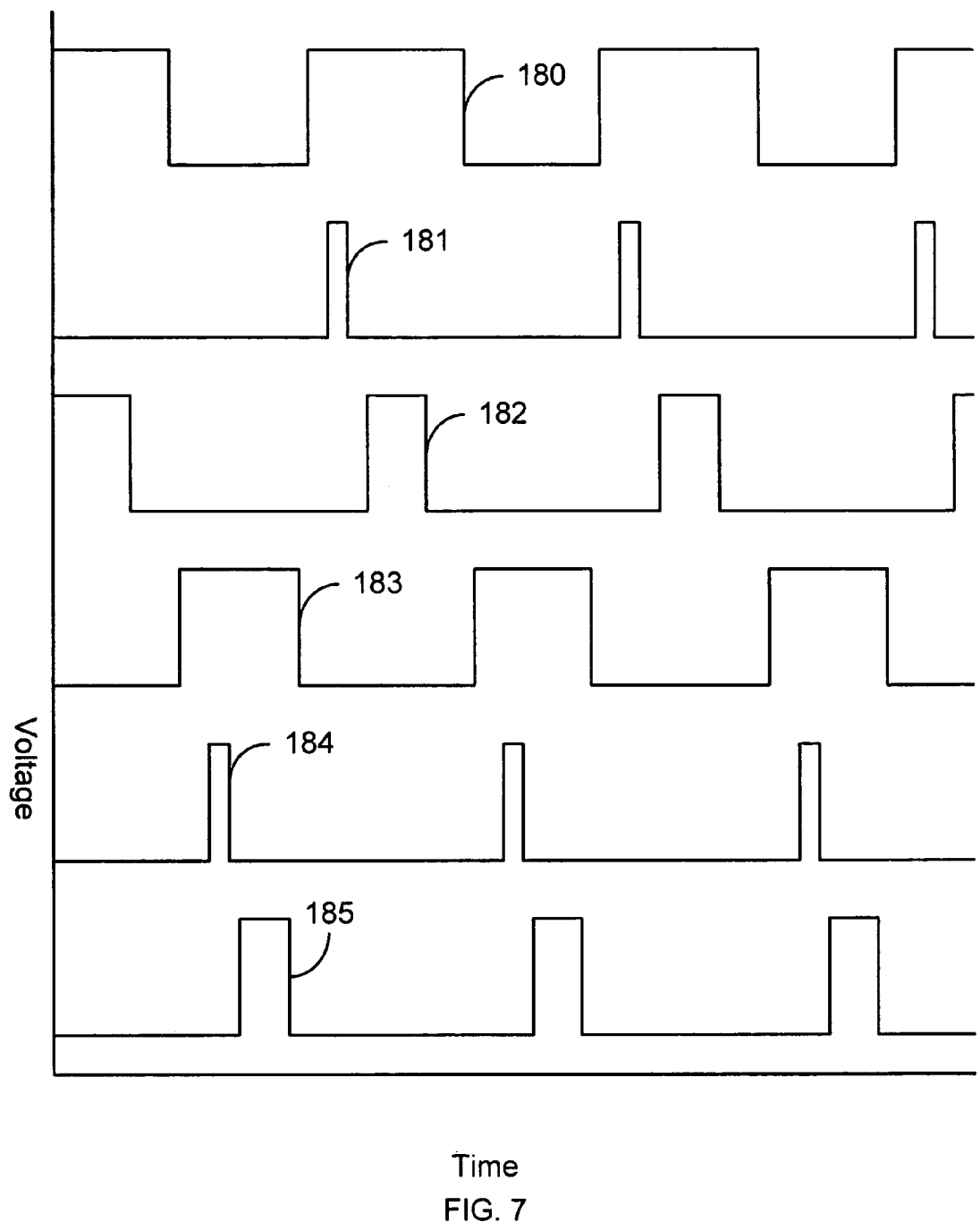
FIG. 7 is a diagram depicting clock signals for in one embodiment of a charge pump in accordance with the present invention.

FIG. 7 is a diagram depicting clock signals 180, 181, 182, 183, 184, and 185 for in one embodiment of a system in accordance with the present invention. The clock signals 180, 181, 182, 183, 184, and 185 preferably vary between zero volts and the supply voltage, $V_{dd}$. Operation of the system 100 using the basic stage 101' and the bi-directional stage 200', is described in the context of the clock signals 180, 181, 182, 183, 184, and 185. Referring to FIGS. 4-7, operation of the system 100 is described.

In a negative configuration, an input voltage, $V_{in}$, is provided at the input 102 and, therefore, at the interface 202'. Furthermore, the bi-directional stage is clocked using signals 180 and 183.

The pumping capacitors 112 and 142 are coupling capacitors that preferably have a large capacitance and are used for the basic charge pumping operation. The capacitors 112 and 142 preferably have a relatively large capacitance to transfer a greater amount of energy. Thus, in one embodiment, the pumping capacitors 112 and 142 have a capacitance on the order of 4 pF. The N-type devices 120 and 150 are used to transfer charge from the nodes 114' and 144', respectively, to the output/input 113 and to prevent reversal current feedback from the output/input 113 to the nodes 114' and 144', respectively, in the negative configuration. The N-type devices 118 and 148 are used to connect the nodes 114' and 144', respectively, to the input/output 111 when the clock signals input to inputs 116 and 146, respectively, are high and thus the capacitors 112 and 142, respectively are not pumped. In the negative configuration, the N-type devices 126' and 156', are used to switch the gates of the N-type devices 118 and 148, respectively, in order to prevent reversal current feedback to the input/output 111 when the pumping capacitors 112 and 142, respectively, are boosted. Auxiliary capacitors 132 and 162 preferably have a small capacitance and are used to generate an overshoot for the gate of the N-type devices 126' and 156', respectively, in the negative configuration. For example, in one embodiment, each of the auxiliary capacitors 132 and 162 has a capacitance on the order of 70 fF when the capacitance of the pumping capacitors 112 and 142 is on the order of 4 pF. Thus, the capacitances of the auxiliary capacitors 132 and 162 are significantly smaller than that of the pumping capacitors 112 and 142, respectively. Because of the overshoot for their gates, the potential at the gate of the N-type device 126' or 156' is higher than the voltage at the input/output 111'. Consequently, in the negative configuration, the node 128 or 158 is fully charged to the node 114' or 144', respectively, when the clock provided to the inputs 124 or 152, respectively has a rising edge.

To further describe the operation of the basic stage 101' in the negative configuration, it can be assumed that initially, the clock signals 180 and 182 are high, while clock signals 181, 183, 184, and 185 are low. Thus, the nodes 144' and 158 are also initially at $V_{in}-V_{dd}$, where $V_{dd}$ is the supply voltage. The node 114' is at $V_{in}$. The node 128 is at $V_{high}$, which is $V_{aux}+C_r V_{dd}$, where $V_{aux}=V_{in}$ and $C_r=1/(1+C_{paraux}/C_{cap122})$, Cparaux is the total parasitic capacitance at node 128 from the devices 118 and 126'. In addition, the inputs 166 and 136 are either coupled to the nodes 206 and 208 of the bi-directional stage 200' or, for subsequent basic stages 101' (if any), to the nodes 114' and 144', respectively, of a previous basic stage 101'. Consequently, the initial signal provided to node 136 is the voltage at node 144'+$V_{dd}$. Similarly, the initial signal provided to the node 166 is the voltage at the node 114'+$V_{dd}$.

The signal 182 switches low, to 0. Consequently, the node 128 falls to $V_a$, which is $V_{high}-C_r V_{dd}$. The clock signal 180 switches low, to zero. Thus, the voltage at node 114' falls to $V_{in}-V_{dd}$. Similarly, the node 128 goes to $V_{in}-V_{dd}$, which is connected to the node 114' through the N-type device 126'. At substantially the same time, the N-type device 160 turns off and the node 161 keeps its initial value of $V_{in}$, but floats.

Next, the clock signal 183 goes high. As a result, the node 144' rises to $V_{in}$ and the node 158 rises to $V_{auxi}$ where $V_{auxi}=V_{in}-V_t$ through the N-type device 156'. Because the node 144' is at $V_{in}$, the N-type device 120 turns on and charge transfer occurs from the output/input 113 to the node 114'. Because the N-type devices 118 and 150 have their gates connected to $V_{in}-V_{dd}$, the N-type devices 118 and 150 are turned off and no reversal charge transfer occurs. The N-type device 130 is on and the voltage at node 131 is $V_{in}$. To reduce or eliminate the effects of a low $V_{dd}$, a dedicated phase is added to create a short pulse with the clock signal 184 on the coupling capacitor 162. This may allow all charge to be transferred from the node 144' to the node 158. Consequently, the voltage at the node 158 increases to $V_{aux}$, where $V_{aux}=V_{in}$. As a result, the basic stage 101' can function at a very low supply voltage.

Next, the voltage at the node 161 varies from $V_{in}$ to $V_{in}+C_3(V_{dd})$ during the rising edge of the clock signal 184 and from $V_{in}+C_3(V_{dd})$ to $V_{in}$ during the falling edge of the clock signal 184. The operator $C_3$ is $1/(1+C_{parasitic}/C_{162})$ where $C_{parasitic}$ is the parasitic capacitance at the node 161 due to the N-type devices 160 and 156.

During the last phase, the clock signal 185 goes high. As a result, the node 158 switches to a high voltage, $V_{high}$, and the N-type device 148 turns on. Consequently, charge is transferred from the node 144' to the input/output 111, which will be the next pumped node.

Thus, the first half of the period of operation may be completed. During the first half of the period, charge is transferred from the output/input 113 to the node 114' and from the node 144' to the input/output 111. When this charge transfer is completed, a second half of the period is commenced. The second half of the period is symmetric with respect to the first half of the period. The second half of the period commences when the clock signal 185 is switched low. Then, switching the clock signal 183 low decreases the potential of the node 158 to $V_{in}-V_{dd}$. Next, the clock signal 180 pulses high to turn the N-type device 150 on, and start charge transfer from the output/input 113 to the node 144'. An overshoot for the voltage at the node 131 is generated by pulsing the clock signal 181 to transfer the charge from the node 114' to the node 128. The final portion of the period occurs when the clock signal 182 is switched high to turn the N-type device 118 on. Thus, during this second half of the period, charge from the node 114' to the input/output 111 and from the output/input 113 to the node 144'.

Thus, during the first half of the period for the clock signals depicted in FIG. 7, charge is transferred from the output/input 113 to the node 114'. At the same time, the input/output 111 receives charge from the node 144'. During the second half of the period, charge from the node 114' to the input/output 111 and from the output/input 113 to the node 144'. Thus, the stages 140' alternately charge and discharge. In addition, in order to ensure that the capacitors 112 and 142, and thus the nodes 128 and 158, are completely charged, the auxiliary capacitors 132 and 162 are used. The auxiliary capacitors 132 and 162 generate an overshoot of the voltage on the gates of the N-type devices 126' and 156', respectively, during the rising edge of the clock signals 181 and 184, respectively. Thus, in the steady state operation of the charge pump 100, the pumping nodes 114' and 144' have a voltage that varies from $V_{in}$ to $V_{in}-C_1(V_{dd})$, where $C_1$ is $1/(1+C_{par}/C_{112})$ and $C_{par}$ is the parasitic capacitance at the node 114' due to the N-type devices 118, 120, 126', and 150. If it is assumed that the parasitic capacitance is small, then the variation in voltage at the pumping nodes 114' and 144' is approximately from $V_{in}$ to $V_{in}-V_{dd}$. Thus, the variation in voltage for the pumping nodes 114' and 144' may be as large as possible, while it is ensured that charge is transferred alternately from the nodes 114' and 144'.

Furthermore, in a preferred embodiment, to achieve the desired functionality the gate-source voltages of the N-type devices 118 and 148 are higher than the threshold voltage, $V_t$, for a very low supply voltage. This condition is fulfilled using the N-type devices 130 and 160 as well as the small auxiliary capacitors 132 and 162. Between the rising edges of clock signals 180 and 182, a pulse is provided on the clock signal 181 to enable charge transfer from node 114' to node 128 or from node 144' to node 158. While the clock signal 180 is high and the clock signal 182 is still low, the node 128 is at $V_{in}-V_t$. Before the rising edge of the clock signal 182, a pulse is generated on the clock signal 181 is generated to increase the potential at the node 128 or 158. At such a time, the voltage at the node 128 or 158 is preferably $V_{in}$. Then, the clock signal 182 or 185 switches high to drive the node 128 or 158, respectively, above $V_{in}$ and turn the N-type device 118' or 148, respectively, on. The potential at the node 128 or 158 is $V_{in}+C_r(V_{dd})$, where $C_r$ is $1/(1+C_{para128}/C_{aux})$, $C_{para128}$ is the parasitic capacitance at the node 128, respectively due to the devices 118 and 126'.

Thus, the condition for the desired functionality can be seen as: $V_{gs}$ of N-type devices 118 and 148 is greater than $V_t$. In addition, the $V_{node\ 128}-V_{node\ 114'}>V_t$ or $V_{node\ 158}-V_{node\ 144'}>V_t$. In the event that the clock signals 180 and 182 are high and that a pulse for the clock signal 181 is generated between the rising edges of the clock signals 180 and 182, the following situation results: $V_{node\ 128}=V_{in}+V_{dd}(C_r)$ and the $V_{node\ 114'}=V_{in}$. Combining these conditions results in the minimum workable range of: $V_{dd}>V_t(1+C_{para128}/C_{aux})$. For small parasitic capacitances, the lowest value of $V_{dd}$ is very close to $V_t$.

In a positive configuration, the input voltage, $V_{in}$, is provided at the output/input 113. The basic stage 101' operates in an analogous manner. The capacitors 112 and 142 are large coupling capacitors. The N-type devices 118 and 148 are used to transfer charges from the pumping nodes 114' and 144' to the input/output 111 and to prevent reversal current feedback from the input/output 11' to the pumping node 114' or 144', respectively. N-type devices 120 and 150 are used to connect the pumping nodes 114' and 144', respectively, to the output/input 113 when the pumping capacitor 112 and 142, respectively, are not pumped (when clock signals 180 and 183, respectively, are low). The N-type devices 126' and 156' are used to switch the gate of the N-type devices 118 and 148, respectively, to the boosted pump node potential in order to prevent reversal current feedback to the input/output 111 when the pumping capacitors 112 and 142, respectively, are not boosted. Auxiliary capacitors 122 and 142 are used to generate an over-shoot on the gate of N-type devices 118 and 148, respectively, to have the N-type devices 118 and 148, respectively on when charge is transferred from the pumping node 114 and 144, respectively to the input/output 111. In order to allow for good charge transfer from the pumping nodes 114' and 144', an overshoot is generated on the gates of the N-type devices 126' and 156', respectively, using the auxiliary capacitor 132 and 162, respectively. Consequently, when the signal 180 or 183 is high, the overshoot on the auxiliary capacitor 132 and 163, respectively, increases the potential at nodes 131 and 161, respectively, to become higher than the input voltage $V_{in}$ in order to fully charge the nodes 128 and 158, respectively, from the nodes 114' and 144', respectively, before the rising edge of clock signals 182 and 185, respectively.

Thus, a boosted voltage may be provided on the input/output 111. In order to provide the output via line 102, the bi-directional stage 200' is used. When multiple basic stages 101' are used, the inputs 166 and 136 are coupled to the nodes 114' and 144' of the subsequent stage. In the positive configuration, therefore, the inputs 166 and 136 would float if not for the presence of the bi-directional stage 200'. Consequently, the nodes 206 and 208 are coupled to the inputs 166 and 136, respectively, of the basic stage 101' closest to the bi-directional stage 200'.

To further describe the operation of the basic stage 101' and the bi-directional in the positive configuration, it can be assumed that initially, the clock signals 180, 181, 182, and 184 are low, while clock signals 183 and 185 are high. Thus, the nodes 144' and 158 are also initially at $V_{in}+V_{dd}$ and $V_{high}$, respectively, where $V_{dd}$ is the supply voltage. The nodes 114' and 128 are at $V_{in}$. The nodes 166 and 126 are connected to nodes 114 and 144, respectively, from the next stage (for multiple basic stages 101') or to the nodes 206 and 208, respectively, from the bi-directional stage 200' (for only one basic stage 101' or the closest basic stage 101' to the bi-directional stage 200'). Thus, the node 166 is at the voltage of node 114' plus $V_{dd}$. Similarly, the node 136 is at the voltage of the node 144' plus $V_{dd}$.

During the first phase, the clock signal 185 switches low, thereby applying a voltage of $V_{aux}$ to the node 158 and turning the N-type device 148 off. Next, the clock signal 183 goes low. Next, the clock signal 183 goes low. As a result, the node 144' switches to $V_{in}$ and the node 158 decreases its voltage through the N-type device 156'. Because the node 136' decreases in voltage from $V_{out}+V_{dd}$ to $V_{out}$, the N-type device 130 turns off. Consequently, the node 131 keeps is initial value of $V_{out}$(node 111), but floats. Furthermore, because node 144' is at $V_{in}$, the N-type device 120 turns off. Moreover, because the N-type devices 118 and 150 have their gates connected to $V_{in}$, the N-type devices 118 and 150 are turned off and no reversal charge transfer occurs.

The clock signal 180 then switches high, to $V_{dd}$. Consequently, the node 114' rises to $V_{in}+V_{dd}$ and charges may be transferred from the output/input 113 to the node 144', which will be the next pumped node. The node 128 is connected to the node 114' through the N-type device 126, rises to $V_{auxi}$. To reduce or eliminate the effects of a low $V_{dd}$, a dedicated phase is added to create a short pulse with the clock signal 181 on the coupling capacitor 132. This may allow all charge to be transferred from the node 114' to the node 128. Consequently, the voltage at the node 128 increases to $V_{aux}$ from $V_{auxi}$. As a result, the charge pump 100 can function in the positive configuration at a very low supply voltage.

Next, the voltage at the node 131 varies from $V_{out}$ to $V_{out}+C_3(V_{dd})$ during the rising edge of the clock signal 181 and from $V_{out}+C_3(V_{dd})$ to $V_{out}$ during the falling edge of the clock signal 181. The operator $C_3$ is described above.

During the next phase, the clock signal 182 goes high. As a result, the node 128 switches to a high voltage and the N-type device 118 turns on. Consequently, charge is transferred to the input/output 111 from the node 114'. Thus, the first half of the period of operation may be completed. During the first half of the period, charge is transferred from the node 114' to the input/output 111 and from the output/input 113 to the node 144'. When this charge transfer is completed, a second half of the period is commenced. The second half of the period is symmetric with respect to the first half of the period. The second half of the period commences when the clock signal 182 is switched low. Switching the clock signal 182 low decreases the potential of the node 128 to $V_{aux}$. Next, the clock signal 180 pulses low to decrease the node 114' and 128 to $V_{in}$. Thereafter, the signal 183 pulses high, turning the N-type device 120 on and starting charge transfer from the output/input 113 to the pumping node 114'. An overshoot for the voltage at the node 161 is generated by pulsing the clock signal 184 to transfer the charge from the node 144' to the node 158. The final portion of the period occurs when the clock signal 185 is switched high to turn the N-type device 148 on. Thus, during this second half of the period, charge from the output/input 113 to the node 114' and from the node 144' to the input/output 111.

Thus, during the first half of the period for the clock signals depicted in FIG. 7, charge is transferred from the node 114' to the input/output 111. At the same time, the node 144' receives charge from the output/input 113. During the second half of the period, charge is transferred from the node 144' to the output/input 111. At the same time, the node 114' receives charge from the output/input 113. Thus, the stages 140' alternately charge and discharge. In addition, in order to ensure that the capacitors 112 and 142, and thus the nodes 128 and 158, are completely charged, the auxiliary capacitors 132 and 162 are used. The auxiliary capacitors 132 and 162 generate an overshoot of the voltage on the gates of the N-type devices 126' and 156'. Thus, in the steady state operation of the charge pump 100, the pumping nodes 114' and 144' have a voltage that varies from $V_{in}$ to $V_{in}+C_1(V_{dd})$. If it is assumed that the parasitic capacitance is small, then the variation in voltage at the pumping nodes 114' and 144' is approximately from $V_{in}$ to $V_{dd}$. Thus, the variation in voltage for the pumping nodes 114' and 144' may be as large as possible, while it is ensured that charge is transferred alternately from the nodes 114' and 144'.

Thus, the condition for the desired functionality can be seen as: $V_{gs}$ of N-type devices 118 and 148 is greater than $V_t$. In addition, the $V_{node\ 128}-V_{node\ 114'}>V_t$ or $V_{node\ 158}-V_{node\ 144'}>V_t$. In the event that the clock signals 180 and 182 are low and that a pulse for the clock signal 181 is generated between the falling edges of the clock signals 180 and 182. This situation results in $V_{node\ 128}=V_{in}+V_{dd}(C_r)$. Combining these conditions results in the minimum workable range of: $V_{dd}>V_t(1+C_{para128}/C_{aux})$. For small parasitic capacitances, the lowest value of $V_{dd}$ is, again, very close to $V_t$.

Thus, the charge pump 100 is bi-directional due to the combination of the basic stage(s) 101' and the bi-directional stage 200'. Thus, a reduced area may be consumed not only because low voltage N-type devices may be used, but also because a single charge pump 100 may be used to generate both positive and negative voltage. Moreover, the charge pump 100 may be operated at very low voltages while providing a higher than supply voltage. As described above, the charge pump 100 can operate at supply voltages approaching $V_t$, which is an improvement even over the charge pump 50. Thus, degradation due to threshold voltage may be reduced or eliminated. The gain for each basic stage 101' is preferably limited by parasitic capacitances only, and the optimal gain for the basic stage 101' may be provided. Thus, the gain each basic stage of the charge pump 100 is $V_{dd}$ ($V_{out}=V_{in}+V_{dd}$). Consequently, the charge pump 100' is not only bi-directional, but also suitable for very low voltage applications.

Figure 8:
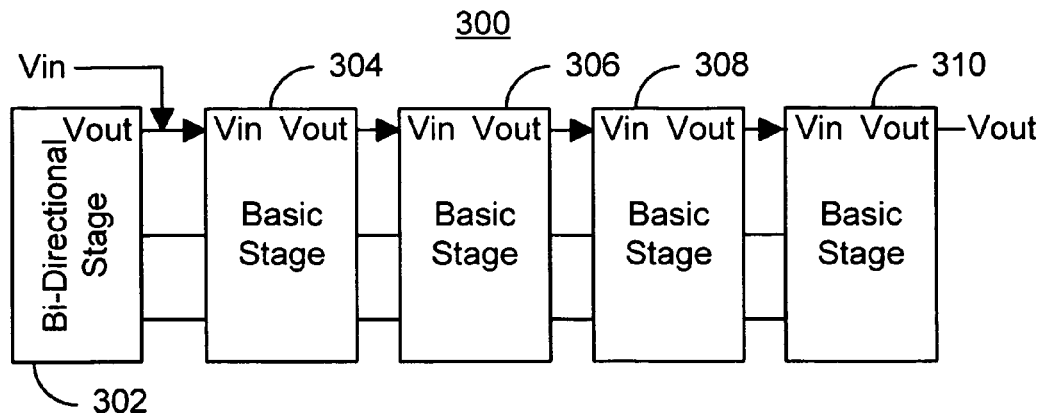
FIG. 8 is a diagram depicting one embodiment of a negative voltage device using multiple basic stages and circuitry in accordance with the present invention.

FIG. 8 is a diagram depicting one embodiment of a bi-directional charge pump 300 utilizing a bi-directional stage 302 and basic stages 304, 306, 308, and 310. The charge pump 300 is in a negative configuration. Consequently, an input voltage is provided to the bi-directional stage 302 and the boosted, output voltage obtained from the last basic stage 310. In the embodiment of the charge pump 300 shown, four stages basic stages 304, 306, 308, and 310 are used. However, another number of basic stages as low as one may be utilized. In addition, the bi-directional stage 302 corresponds to the bi-directional stage 200', while each of the basic stages 304, 306, 308, and 310 corresponds to a basic stage 101'. Consequently, the output voltages from one stage 304, 306, or 308 can be fed into input of the next stage 306, 308, or 310, respectively. The stages 302, 304, 306, 308, and 310 may be driven by clock(s) (not shown) such as the clock 170. Furthermore, each of the stages 304, 306, 308, and 310 provides a gain of approximately $V_{dd}$. In addition, the equation Vout=Vin+N*$C_r V_{dd}$, where N is the number of stages, still holds, even for a weak supply voltage. The gain may thus be increased by cascading the stages 304, 306, 308, and 310. Consequently, the charge pump 100/100' may be scalable.

Figure 9:
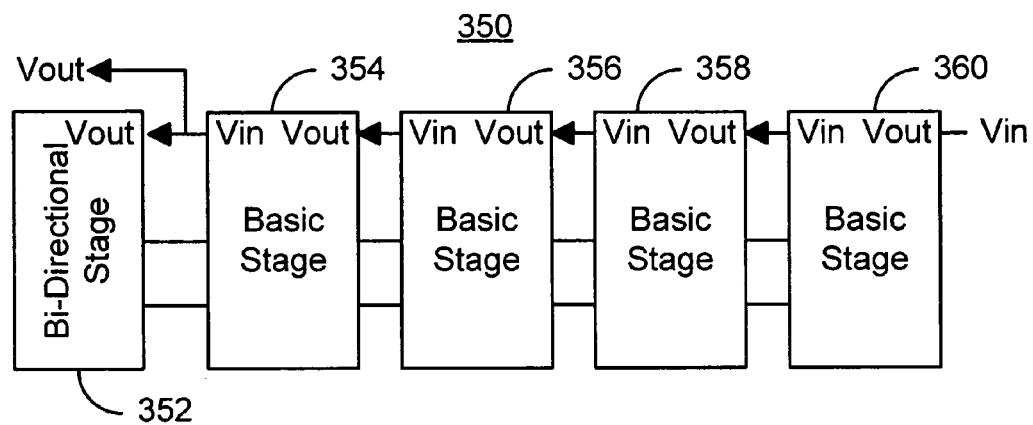
FIG. 9 is a diagram depicting one embodiment of a positive voltage device using multiple basic stages and circuitry in accordance with the present invention.

FIG. 9 is a diagram depicting one embodiment of a bi-directional charge pump 350 utilizing a bi-directional stage 352 and basic stages 354, 356, 358, and 360. The charge pump 350 is in a positive configuration. Consequently, an input voltage is provided to the last basic stage 360 is boosted and the output is provided via the bi-directional stage 352. In the embodiment of the charge pump 350 shown, four stages basic stages 354, 356, 358, and 360 are used. However, another number of basic stages as low as one may be utilized. In addition, the bi-directional stage 352 corresponds to the bi-directional stage 200', while each of the basic stages 354, 356, 358, and 360 corresponds to a basic stage 101'. Consequently, the output voltages from one stage 360, 358, or 354 can be fed into input of the next stage 358, 356, or the bi-directional stage 352, respectively. The stages 352, 354, 356, 358, and 360 may be driven by clock(s) (not shown) such as the clock 170. Furthermore, each of the stages 354, 356, 358, and 360 provides a gain of approximately $V_{dd}$. In addition, the equation Vout=Vin+N*$C_r V_{dd}$, where N is the number of stages, still holds, even for a weak supply voltage. The gain may thus be increased by cascading the stages 354, 356, 358, and 360. Consequently, the charge pump 100/100' may be scalable.

Figure 10:
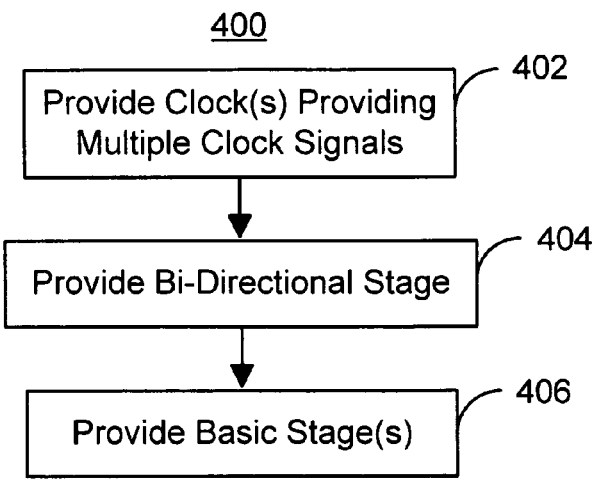
FIG. 10 is a flow chart depicting one embodiment of a method in accordance with the present invention for providing a system for providing a voltage higher than a supply voltage.

FIG. 10 is a flow chart depicting one embodiment of a method 400 in accordance with the present invention for providing a system for providing a voltage higher than a supply voltage. For clarity, the method 400 is described in the context of the system 100 including bi-directional stage 200' and basic stage(s) 110'. However, one of ordinary skill in the art that the method 350 may be used with other systems, including but not limited to the systems 100 and 200.

The clock 170 that drives the charge pump 100 is provided, via step 402. The clock provides a plurality of clock signals that are used to drive the bi-directional stage 200 and the sections 110' and 140' of the basic stage(s) 101'. These multiple clock signals can otherwise be thought of as a clock signal having multiple, separate phases. In a preferred embodiment, a clock that provides six clock signals. Together, the clock signals provide a period of the system 100. Further, each clock signal has transitions at different times from the remaining clock signals during the period. An example of one period of operation is shown in FIG. 7, described above.

The bi-directional stage 200' is provided, via step 404. Thus, the appropriate interface 202 and devices 212, 214, 222, and 224 are provided. The basic stage(s) 101' are provided, via step 406. Thus, step 406 includes providing first section 110' and a second section 140'. Step 406 includes providing the pumping node(s) 114' and 144' that are preferably coupled with a pumping capacitor (not shown). Step 406 may also include providing auxiliary capacitor(s) 122 and 132 and 152 and 162, and N-type device(s) 118, 120, and 126' that is preferably a N-type device. The first stage is configured such that the pumping nodes 114' and 144' charges and fully discharges in response to a first portion of the plurality of clock signals provided by the clock 170. In a preferred embodiment, this is achieved using the auxiliary capacitor(s) 132 to overshoot the voltage on the gate of the device 126' during a portion of the period of the clock signals and a device 130 that is preferably a N-type device. Step 304 also includes providing the second section 140' in an analogous manner to the first section 110'.

Thus, using the method 400, the systems 100, 300, and 350 may be provided using bi-directional stage(s) 200/200' and basic stage(s) 101/101'. As a result, the advantages of the systems 100, 300, and/or 350 may be achieved.

A method and system for providing a bi-directional output voltage greater than a supply voltage provided by a voltage supply in semiconductor devices, such as EEPROMs. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

I claim:

1. A system, comprising:
at least one basic stage, each of the at least one basic stage including a first section and a second section, the first section including at least a first pumping node, at least one pumping capacitor coupled with the at least first pumping node, at least one N-type device coupled with the at least one pumping node, and at least a first auxiliary capacitor and a second auxiliary capacitor and a second auxiliary capacitor for providing an overshoot for the at least one N-type device for at least one value of a plurality of clock signals, the first section including the at least first auxiliary capacitor and the at least one pumping capacitor receiving a first portion of the plurality of clock signals, the second section coupled with the first section and including at least a second pumping node, the plurality of clock signals including a second portion provided to the second section and a third portion provided to a bi-directional stage, the first section and the second section being configured to alternately charge and fully discharge based on the plurality of clock signals, the bi-directional stage including at least one pair of boosting capacitors, at least one pair of N-type devices, and an interface, the bi-directional stage allowing the system to operate in a positive configuration or a negative configuration, the interface being coupled with a first of the at least one basic stage, the interface being connected with an input voltage in the negative configuration and to an output voltage in the positive configuration, and wherein the first section further includes a first section initialization input, a first N-type device coupled to the first auxiliary capacitor and the at least one pumping node, a second N-type device coupled between the at least one pumping node and an output of the system, and a third N-type device coupled between the second auxiliary capacitor and the first section initialization input.

2. The system of claim 1 wherein a first boosting capacitor of the at least one boosting capacitor is coupled to a first N-type device of the at least one pair of N-type devices at a first bi-directional stage node, a second boosting capacitor of the at least one boosting capacitor is coupled to a second N-type device of the at least one pair of N-type devices at a second bi-directional stage node, the first bi-directional stage node being coupled to a second section initialization input, the second bi-directional stage node being coupled to the first section initialization input.

3. The system of claim 1 wherein the at least one N-type device is coupled between the first auxiliary capacitor and the second auxiliary capacitor.

4. The system of claim 1 wherein the at least one N-type device of the at least one basic stage has a threshold voltage and wherein the voltage provided by a voltage supply of the system is has a lower limit corresponding to the threshold voltage.

5. The system of claim 1 wherein the plurality of clock signals includes six clock signals.

6. The system of claim 1 wherein the at least one basic stage further includes a second basic stage, comprising:
   at least a third section corresponding to the first section, the third section being coupled in series with the first section; and
   at least a fourth section corresponding to the second section, the fourth stage being coupled in series with the second section.

7. A system, comprising:
   a bi-directional stage including at least one pair of boosting capacitors, at least one pair of N-type devices, and an interface, the bi-directional stage allowing the system to operate in a positive configuration or a negative configuration, the interface being connected with an input voltage in the negative configuration and to an output voltage in the positive configuration; and
   at least one basic stage coupled to the bi-directional stage, a first of the at least one basic stage coupled to the bi-directional stage, each of the at least one basic stage including a first section and a second section, the first section including at least a first pumping node, a first pumping capacitor coupled with the first pumping node, a first N-type device coupled with the first pumping node, and at least a first auxiliary capacitor and a second auxiliary capacitor for providing an overshoot for the first N-type device for at least a first value of a plurality of clock signals, a second section coupled with the first section and including a second pumping node, a second pumping capacitor coupled with the second pumping node, a second N-type device coupled with the second pumping node, and at least a third auxiliary capacitor and a fourth auxiliary capacitor for providing an overshoot for the second N-type device for at least a second value of the plurality of clock signals;
   wherein a first portion of the plurality of clock signals is provided to the first section, a second portion of the plurality of clock signals is provided to the second section, and a third portion of the plurality of clock signals is provided to the bi-directional stage, the first stage and the second stage being configured to alternately charge and fully discharge the first pumping node and the second pumping node based on the plurality of clock signals;
   an output wherein the first section further includes a first section initialization input, a third N-type device coupled to the first auxiliary capacitor and the first pumping node, a fourth N-type device coupled between the first pumping node and the output, and a fifth N-type device coupled between the second auxiliary capacitor and the first section initialization input; and
   wherein the second section further includes a second section initialization input, a sixth N-type device coupled to the third auxiliary capacitor and the second pumping node, a seventh N-type device coupled between the second pumping node and the output, and an eighth N-type device coupled between the fourth auxiliary capacitor and the first section initialization input.

8. The system of claim 7 wherein the first N-type device is coupled between the first auxiliary capacitor and the second auxiliary capacitor and between each of the first and second auxiliary capacitors and the pumping node, and wherein the second N-type device is coupled between the third auxiliary capacitor and the fourth auxiliary capacitor and between each of the third and fourth auxiliary capacitors and the second pumping node.

9. The system of claim 8 wherein a first boosting capacitor of the at least one pair of boosting capacitors is coupled to a first device of the at least one pair of N-type devices at a first bi-directional stage node, a second boosting capacitor of the at least one pair of boosting capacitors is coupled to a second device of the at least one pair of N-type devices at a second bi-directional stage node, the first bi-directional stage node being coupled to the second section initialization input, the second bi-directional stage node being coupled to the first section initialization input.

10. A method, comprising:
    providing at least one basic stage, the at least one basic stage including a first section and a second section, the first section including at least a first pumping node, at least one pumping capacitor coupled with the at least first pumping node, at least one N-type device coupled with the at least first pumping node, and at least a first auxiliary capacitor and a second auxiliary capacitor for providing an overshoot for the at least one N-type device for at least one value of a plurality of clock signals, the first section including the at least first auxiliary capacitor and the at least one pumping capacitor receiving a first portion of the plurality of clock signals, the second section coupled with the first section and including at least a second pumping node, the plurality of clock signals including a second portion provided to the second section and a third portion provided to a bi-directional stage, the first section and the second section being configured to alternately charge and fully discharge based on the plurality of clock signals;
    providing the hi-directional stage including at least one pair of boosting capacitors, at least one additional pair of N-type devices, and an interface, the hi-directional stage allowing the system to operate in a positive configuration or a negative configuration, the interface coupled to a first of the at least one basic stage, the interface being connected with the input voltage in the negative configuration and to the output voltage in the positive configuration;
    providing a first section initialization input;
    providing a first additional N-type device coupled between the first auxiliary capacitor and the at least one pumping node;
    providing a second additional N-type device coupled between the at least one pumping node and an output; and
    providing a third additional N-type device coupled between the second auxiliary capacitor and the first stage initialization input.

11. The method of claim 10 further comprising:
    providing a bi-directional stage including at least one pair of boosting capacitors, at least one pair of N-type devices, and an interface, the bi-directional stage allowing the system to operate in a positive configuration or a negative configuration, the interface coupled to a first of the at least one basic stage, the interface being connected with an input voltage in the negative configuration and to an output voltage in the positive configuration.

12. The method of claim 10 wherein a first boosting capacitor of the at least one boosting capacitor is coupled to a first N-type device of the at least one pair of N-type devices at a first bi-directional stage node, a second boosting capacitor of the at least one boosting capacitor is coupled to a second N-type device of the at least one pair of N-type devices at a second bi-directional stage node, the first bi-directional stage node being coupled to a second section initialization input, the second bi-directional stage node being coupled to the first section initialization input.

13. The method of claim 10 wherein the at least one N-type device of the at least one basic stage is coupled between the first auxiliary capacitor and the second auxiliary capacitor.

14. The method of claim 10 wherein the at least one N-type device of the at least one basic stage has a threshold voltage and wherein the voltage provided by a voltage supply of the system is has a lower limit corresponding to the threshold voltage.

15. The method of claim 10 wherein the plurality of clock signals includes six different clock signals.

16. The method of claim 11 wherein the at least one basic stage further includes a plurality of basic stages.

17. A method, comprising:
providing a bi-directional stage including at least one pair of boosting capacitors, at least one pair of N-type devices, and an interface, the bi-directional stage allowing the system to operate in a positive configuration or a negative configuration, the interface being connected with an input voltage in the negative configuration and to an output voltage in the positive configuration; and
providing at least one basic stage coupled to the bi-directional stage, a first of the at least one basic stage coupled to the interface of the bi-directional stage, each of the at least one basic stage including a first section and a second section, the first section including at least a first pumping node, a first pumping capacitor coupled with the first pumping node, a first N-type device coupled with the first pumping node, and at least a first auxiliary capacitor and a second auxiliary capacitor for providing an overshoot for the first N-type device for at least a first value of a plurality of clock signals, the second section coupled with the first section and including a second pumping node, a second pumping capacitor coupled with the second pumping node, a second N-type device coupled with the second pumping node, and at least a third auxiliary capacitor and a fourth auxiliary capacitor for providing an overshoot for the second N-type device for at least a second value of the plurality of clock signals, wherein a number of N-type devices of the bi-directional stage is less than a number of N-type devices of the at least one basic stage;
wherein a first portion of the plurality of clock signals is provided to the first section, a second portion of the plurality of clock signals is provided to the second section, and a third portion of the plurality of clock signals is provided to the bi-directional stage, the first stage and the second stage being configured to alternately charge and fully discharge the first pumping node and the second pumping node based on the plurality of clock signals.

18. A method, comprising:
generating a plurality of clock signals; and utilizing the plurality of clock signals to drive a bi-directional stage and at least one basic stage, the bi-directional stage including at least one pair of boosting capacitors, at least one pair of N-type devices, and an interface, the bi-directional stage allowing the system to operate in a positive configuration or a negative configuration, the interface being connected with an input voltage in the negative configuration and to an output voltage in the positive configuration, at least one basic stage coupled to the bi-directional stage, a first of the at least one basic stage coupled to the interface of the bi-directional stage, each of the at least one basic stage including a first section and a second section, the first section including at least a first pumping node, a first pumping capacitor coupled with the first pumping node, a first device coupled with the first pumping node, and at least a first auxiliary capacitor and a second auxiliary capacitor for providing an overshoot for the first device for at least a first value of the plurality of clock signals, the second section coupled with the first section and including a second pumping node, a second pumping capacitor coupled with the second pumping node, a second device coupled with the second pumping node, and at least a third auxiliary capacitor and a fourth auxiliary capacitor for providing an overshoot for the second device for at least a second value of the plurality of clock signals, wherein each of the at least one basic stage includes an output, wherein the first section further includes a first section initialization input, a first N-type device coupled between the first auxiliary capacitor and the first pumping node, a second N-type device coupled between the first pumping node and the output, and a third N-type device coupled between the second auxiliary capacitor and the first section initialization input, and wherein the second section further includes a second section initialization input, a fourth N-type device coupled with the third auxiliary capacitor and the second pumping node, a fifth N-type device coupled between the second pumping node and the output, and a sixth N-type device coupled between the fourth auxiliary capacitor and the second section initialization input.

19. The method of claim 18 wherein the first device is a seventh N-type device coupled between the first auxiliary capacitor and the second auxiliary capacitor and between each of the first and second auxiliary capacitors and the pumping node, and wherein the second device is a eighth N-type device coupled between the third auxiliary capacitor and the fourth auxiliary capacitor and between each of the third and fourth auxiliary capacitors and the second pumping node.

* * * * *

UNITED STATES PATENT AND TRADEMARK OFFICE
CERTIFICATE OF CORRECTION

PATENT NO. : 7,652,522 B2  Page 1 of 1
APPLICATION NO. : 11/515637
DATED : January 26, 2010
INVENTOR(S) : Emmanuel Racape It is certified that error appears in the above-identified patent and that said Letters Patent is hereby corrected as shown below:

In column 15, line 9, in Claim 4, delete "the" and insert -- a --, therefor.

In column 16, line 42, in Claim 10, delete "hi-directional" and insert -- bi-directional --, therefor.

In column 16, line 44, in Claim 10, delete "hi-directional" and insert -- bi-directional --, therefor.

In column 16, line 62, in Claim 11, delete "a" and insert -- the --, therefor.

In column 16, line 63, in Claim 11, after "of" insert -- additional --.

In column 17, line 18, in Claim 14, after "wherein" delete "the" and insert -- a --, therefor.

In column 18, line 52, in Claim 19, delete "a" and insert -- an --, therefor.

Signed and Sealed this

Twentieth Day of April, 2010

David J. Kappos
*Director of the United States Patent and Trademark Office*